United States Patent
Bonni et al.

(10) Patent No.: US 6,924,439 B1
(45) Date of Patent: Aug. 2, 2005

(54) SIGNAL CONDUCTING APPLIQUE AND METHOD FOR USE WITH PRINTED CIRCUIT BOARD

(75) Inventors: Christopher S. Bonni, Bridgewater, MA (US); Jerry Jarvis, South Weymouth, MA (US); Thomas Savage, Everett, MA (US); James Harvey Smith, Sagamore Beach, MA (US); Joanne Sheehan, North Easton, MA (US); Robert Wiley, Topsfield, MA (US); David Potter, Acton, MA (US)

(73) Assignee: Network Engines, Inc., Canton, MA (US)

( * ) Notice: Subject to any disclaimer, the term of this patent is extended or adjusted under 35 U.S.C. 154(b) by 159 days.

(21) Appl. No.: 10/325,593

(22) Filed: Dec. 20, 2002

Related U.S. Application Data

(60) Provisional application No. 60/343,354, filed on Dec. 21, 2001.

(51) Int. Cl.[7] .............................................. H05K 1/11

(52) U.S. Cl. ...................... 174/254; 174/260; 361/749; 361/803; 29/830

(58) Field of Search ............................... 361/749–751, 361/784, 789, 803; 174/254, 260; 439/67, 439/493; 349/149–152; 29/830

(56) References Cited

U.S. PATENT DOCUMENTS

| | | | |
|---|---|---|---|
| 6,274,819 B1 * | 8/2001 | Li et al. | ...................... 174/254 |
| 6,512,673 B1 | 1/2003 | Wiley | |
| 6,533,587 B1 | 3/2003 | Potter et al. | |
| 6,590,768 B1 | 7/2003 | Wiley | |
| 6,621,693 B1 | 9/2003 | Potter et al. | |

\* cited by examiner

*Primary Examiner*—John B. Vigushin
(74) *Attorney, Agent, or Firm*—David J. Powsner; Nutter McClenner & Fish LLP

(57) ABSTRACT

The invention herein pertains to improved methods and apparatus for electrically coupling components within a digital data system without the use of ribbon cables and other wires. The disclosed coupling device comprises a body member and at least one finger member. The body member physically and electrically couples with components mounted on a circuit board by mating with component pins extending on a solder side of the circuit board. The finger member is conjoined with the body member, and is a flexible, twistable, thin member containing electrically conductive vias coupled which couple the mounted components with an electrical connected located at the distal end of the finger member. The electrical connector at the distal end of the finger member can be a solder pad, a further member body, or other electrically coupling connector device. The finger member is designed to impact cooling air flow less than the disturbances created by conventional component coupling methods and apparatus, e.g., ribbon cable and wires, thereby increasing the effective heat dissipation within the digital data system.

18 Claims, 4 Drawing Sheets

SIGNAL CONDUCTING APPLIQUE AND METHOD FOR USE WITH PRINTED CIRCUIT BOARD

This application claims priority from earlier filed provisional U.S. application Ser. No. 60/343,354, filed Dec. 21, 2001, titled "Flexible Circuit-Card For Replacement of Connections in Digital Data Processing Equipment," which is incorporated herein by reference.

BACKGROUND OF THE INVENTION

The present invention relates to digital data processing devices, and, in particular, to methods and apparatus for providing electrical (or signalling) connections to circuit boards and the components that reside on them. The invention has application, by way of non-limiting example, in devices where space is at a premium, where overheating is of concern, and/or where connectivity is desired with pins or signal traces on a board that are not readily accessible, e.g., for connection to off-board devices, boards and other components.

In a digital data processing unit, a main circuit board containing processors, computer memory and/or other hardware components typically has numerous electrical connections to other electronic components and circuit boards. These may be to power supplies, switches, storage devices, I/O devices or other hardware.

Unfortunately, the wires and cables (hereinafter collectively "cables") that provide these connections tend to clutter the interior of the unit's chassis and, further, to block air flow needed for cooling the hardware. Though the cables can sometimes be re-routed and fans provided to compensate for such blockage, the tendency toward more densely packed circuitry and lower profile devices renders even this problematic. The integrity of the cables and their connectors, moreover, may suffer from flexing, abrasion or loosening if the chassis is repeatedly opened or the cables are frequently jarred.

An object of this invention is to provide improved digital data processing apparatus (and other electronic devices) and methods of manufacture thereof.

Yet another object is to provide such apparatus and methods as are particularly adapted to compact design and/or designs intolerant of overheating.

Still another further object of the invention is to provide such apparatus and methods as can be adapted to pre-existing equipment, as well as designed for use in new equipment.

Still another object of the invention is to provide such methods and apparatus as reduce the costs of manufacture.

SUMMARY OF THE INVENTION

The foregoing are among the objects attained by the invention which provides, in one aspect, a signal routing element for use with a pre-assembled printed circuit board of the type having one or more electrical components already mounted on a substrate and having pads, pins and/or throughways (collectively, "pads") to which those components are electrically coupled. The signal routing element comprises a first portion with one or more signal conducting junctions corresponding in location to one or more selected pads on the circuit board. The first portion also comprises one or more signal conducting vias that are electrically coupled to the junctions. The first portion is sized so that, when it is placed in physical contact with the printed circuit board, the signal conductive junctions align with their respective selected pads to permit electrical coupling of signals therebetween.

A second portion of the flexible planar sheet extends from the first portion and, itself, comprises one or more signal conductors that are coupled to the signal conducting vias of the first portion. The second portion is so disposed as to carry signals to/from one or more devices, components, etc., off the circuit board from/to the selected pads—by way of the signal conductors of the second portion, the signal conducting vias of the first portion and the signal conducting junctions of the first portion.

Further aspects of the invention provide a signal routing element as described above in which the first and second portions are formed from a single sheet. Related aspects of the invention provide such a routing element where that single sheet comprises a thin, flexible substrate. A still further related aspect of the invention provides such an element where that sheet is polymeric.

Other aspects of the invention provided a signal routing element as described above in which the signal conducting junctions of the first portion are, themselves, solder pads with apertures for passage of component pins. A related aspect of the invention provides such a routing element where in one or more of those solder pads are visually marked, e.g., with heroes or otherwise for ready identification during assembly.

Yet still other aspects of the invention provide a circuit board assembly comprising a printed circuit board as described above (with electrical components mounted on a substrate and with pads to which those components are electrically coupled) and a signal routing element as described above. The assembly is arranged so that the solder pads of the circuit board and the circuit board itself are sandwiched between the routing element and the components.

In another aspect, the invention provides methods for manufacture of a routing element as described above in which the first and second portions are formed from a single sheet of (flexible) substrate. That substrate is split, cut or otherwise partially divided in order to partially separate the first portion from the second portion, e.g., so that the former can be affixed to the pre-assembled circuit board and the latter can be routed to the other boards, devices and/or components to which it is coupled.

The invention provides, in other aspects, a routing element as described above, e.g., for use with digital data processing or other electronic apparatus.

The invention provides in further aspects methods of fabricating such a routing element and/or assembling a digital data processor or other electronic apparatus therewith.

These and other aspects are evident from the drawings and specification that follows.

BRIEF DESCRIPTION OF THE ILLUSTRATED EMBODIMENT

A more complete understanding of the invention may be attained by reference to the drawings, in which.

DETAILED DESCRIPTION OF THE ILLUSTRATED EMBODIMENT

Figure 1:
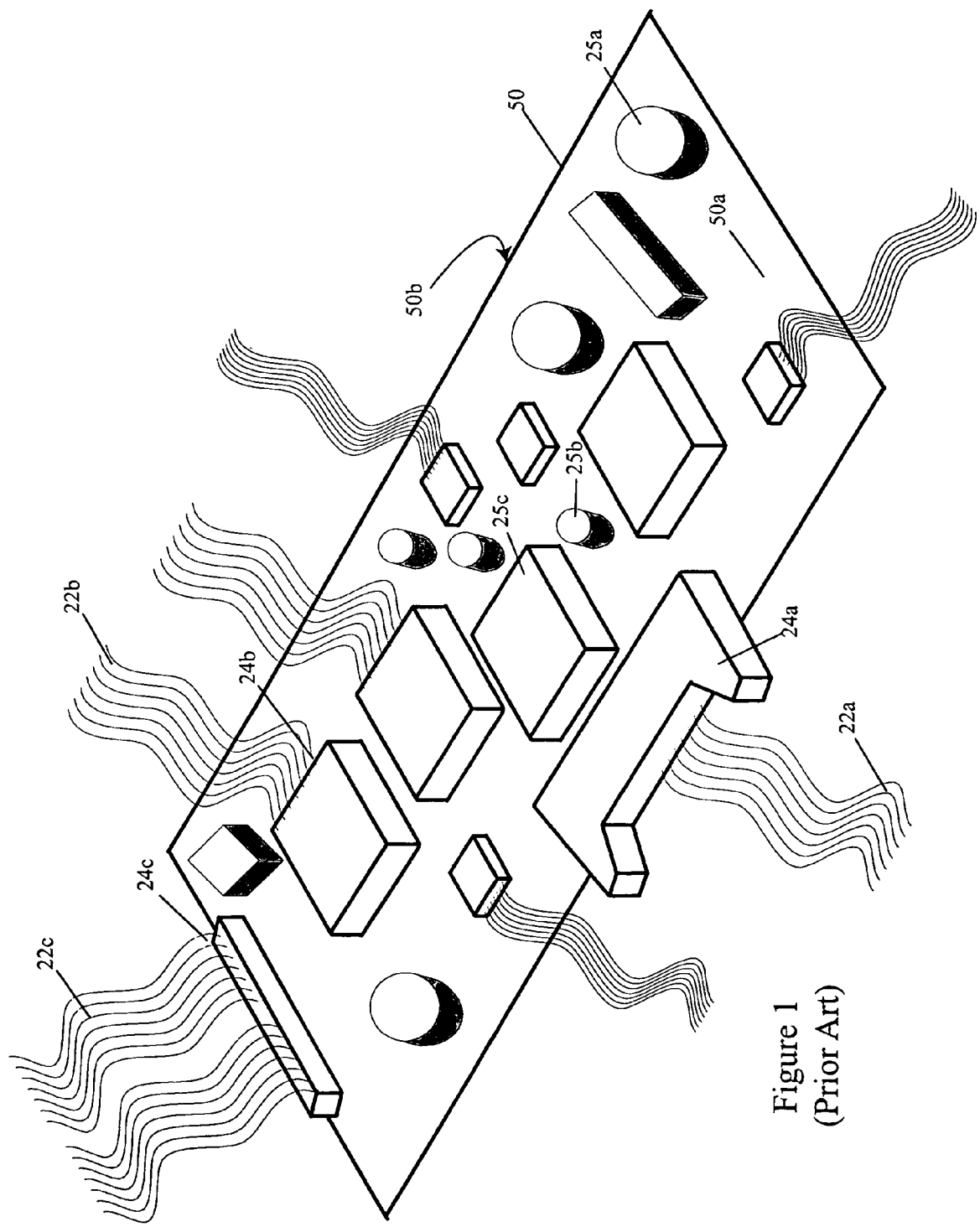
FIG. 1 depicts a circuit board configured with coupling with other system components via ribbon wire connectors in accord with the prior art.

FIG. 1 depicts a circuit board 50 assembly according to the prior art. The board 50 is of the type used in a digital data processing system, a part therein (e.g., a storage device) or other electronic system. The board 50 has a face side 50a upon which components, e.g. integrated circuits or other circuit elements 25a, 25b, 25c, are mounted. It also has a solder side 50b (opposite the face side 50a) with (i) solder pads to which the component pins are soldered and (ii) conductive vias providing electrical connection therebetween, all in the conventional manner known in the art. Though not illustrated here, components may be mounted on solder side 50b and pads/conductive vias may be provided on the face side 50a or internally, again, all in the conventional manner known in the art.

Ribbon cables 22a, 22b, 22c provide electrical coupling between the circuit board and other boards or devices (not shown) in the system. Typically, such coupling is for purposes of control, data and other signaling, though it can be for other purposes known in the art. Moreover, cabling arrangements other than ribbon cables (e.g. individual insulated wires, and so forth) may be used for signaling and/or those other purposes. Regardless, the cabling is coupled to board 50 using connectors—here, cable connectors 24a, 24b, 24c—which are physically mounted to the board 50 and electrically coupled to its constituent components by way of the conductive vias mentioned above.

Figure 2:
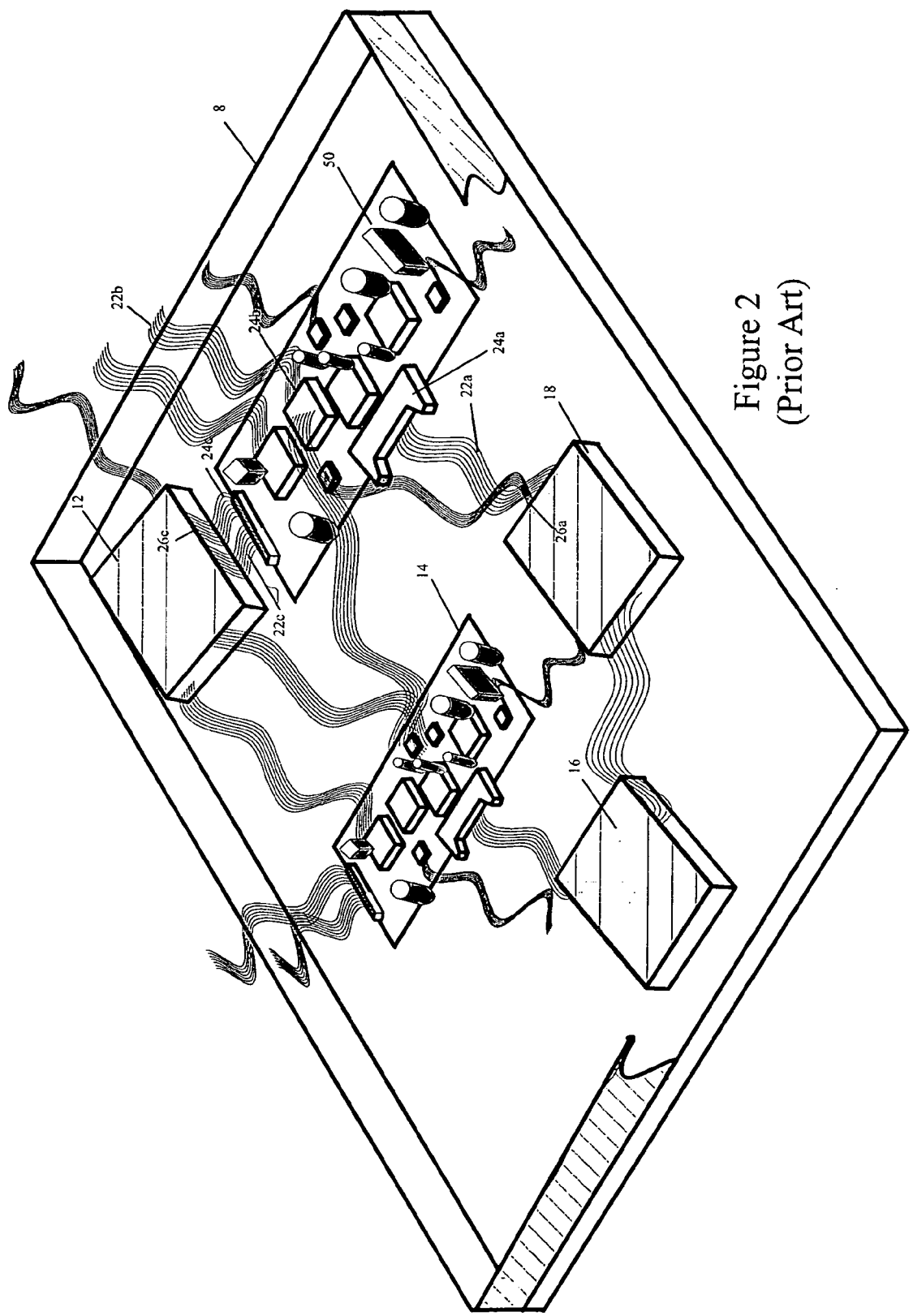
FIG. 2 depicts a digital data processor (or other electronic apparatus) including the circuit board of FIG. 1 that is coupled with other system components via ribbon wire connectors in accord with the prior art.

Often, numerous circuit boards, such as board 50 shown in FIG. 1, are placed within a single chassis, together with other devices, such as power supplies, fans, and so forth. One such arrangement is depicted in FIG. 2, wherein the board 50 is disposed in a 1U chassis 8—that is, a chassis sized in accord with the industry standard "1U" designation—along with a power supply 12, disk drive 14, and other components 16, 18. A spaghetti-like pattern of ribbon cabling (e.g., 22a, 22c) carries signals between the board 50 and the other components (e.g., 12, 14, 16, 18), as well as among and between those other components themselves. As above, ribbon cable connectors 26a, 26c provide electrical and mechanical coupling between the board 50 and the ribbon cables as is typical in the art.

Together, the ribbon cables and their connectors reduce space available within the chassis 8. The connectors, themselves, consume "real estate" on the printed circuit boards, necessitating that the components on them be packed more tightly. And, like the ribbon cables which they connect, the connectors obstruct air flow in the chassis. This is increasingly problematic as board densities and power consumption increase, since these raise temperatures within the chassis which must be dissipated—typically by cooling air flow—in order for the systems to run properly.

Several improvements in improving air flow through chassis 8 are described in co-pending commonly assigned patent applications, e.g., U.S. patent application Ser. No. 09/899,762 filed Jul. 5, 2001, entitled "Low Profile Equipment Housing with Angular Fan," U.S. patent application Ser. No. 09/899,512, filed Jul. 5, 2001, entitled "Ventilating Slide Rail Mount," U.S. patent application Ser. No. 09/899, 760 filed Jul. 5, 2001, entitled "Low Profile, High Density Storage Array," U.S. Ser. No. 09/899,522, filed Jul. 5, 2001, entitled "Circuit Board Riser" and U.S. patent application Ser. No. 09/899,761, filed Jul. 5, 2001 entitled "Power Supply For Low Profile Equipment Housing." The teachings of all of the foregoing patent applications are incorporated herein by reference.

Figure 3:
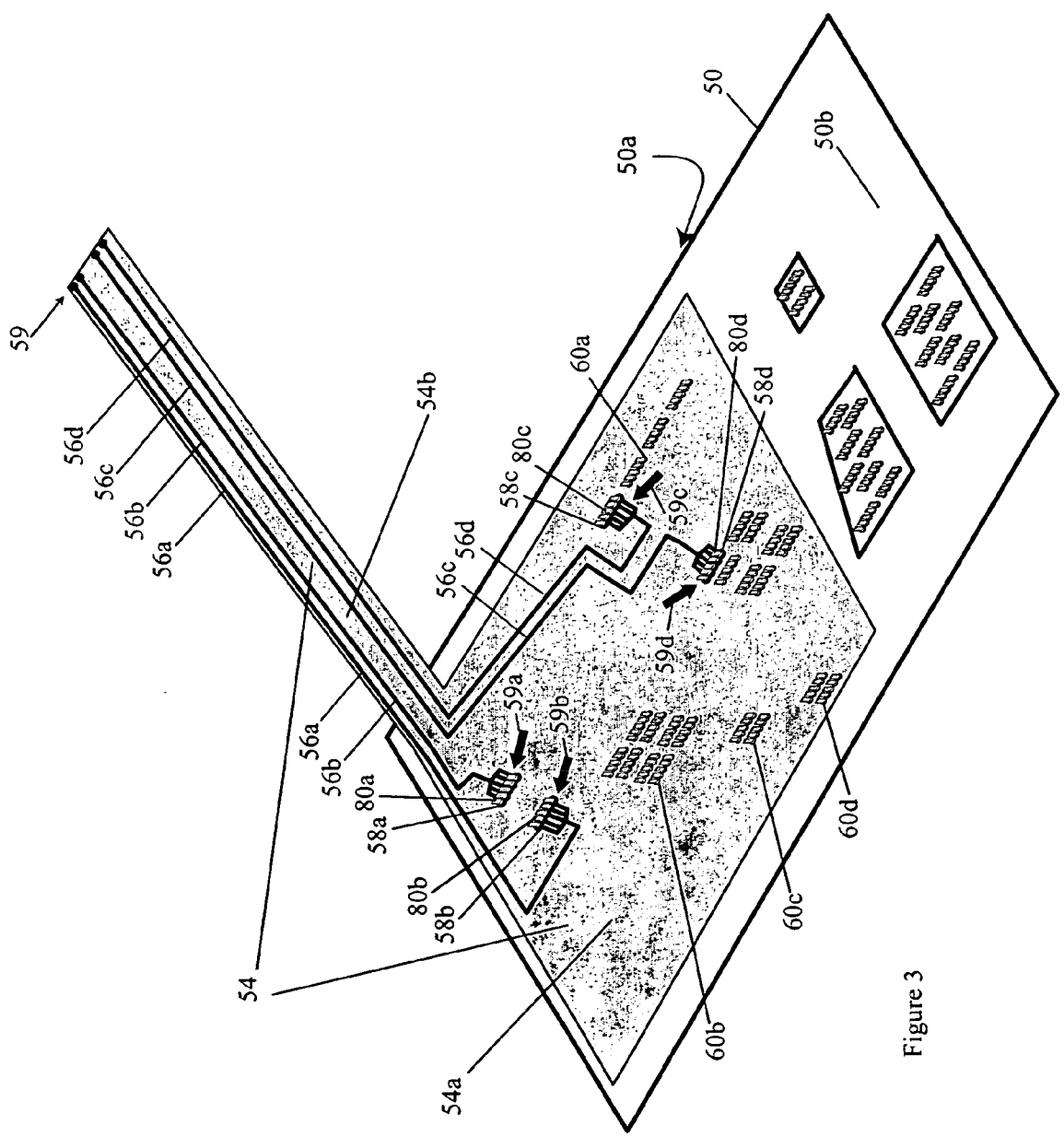
FIG. 3 depicts a circuit board configured for coupling with other system components via a routing element according to the invention.

Referring to FIG. 3, the illustrated embodiment provides still further improvements in chassis air flow by providing a signal routing element 54 that is fabricated separately from circuit board assembly 50 but soldered or otherwise electrically coupled to it—and, particularly, to its solder pads or other junctions (collectively referred to as "solder pads")—typically, following fabrication of the circuit board 50 and mounting of components 25a, 25b, 25c on the board. Thus, rather than comprising a substrate that is disposed or sandwiched between the components and the solder pads (as is the case of the circuit board 50 itself), the signal routing element 54 is disposed beyond the solder pads. Hence, along with the components, the signal routing element 54 sandwiches both the solder pads and the circuit board substrate. In some embodiments, such as those illustrated here, the signal routing element is referred to as an appliqué, since it is thin and flexible and since it is applied subsequent to assembly of the circuit board itself.

As above, FIG. 3 depicts the solder face 50b of a conventional printed circuit board 50 having a top surface 50a on which chips and/or other circuit elements (e.g., diodes, transistors, capacitors, and so forth) are mounted. As above, on the solder face 50b are solder pads, pins and/or conductive throughways via which the chips and/or other circuit elements are electrically coupled, in the usual manner known in the art. The circuit board 50 can be a mother board, daughter card and/or any other such fabrication rigid, flexible or otherwise having chips or other components thereon.

Mounted on the solder face 50b of the board 50 is the aforementioned signal routing element or appliqué—in this case, a thin, flexible, planar member fabricated, for example, in the manner of a so-called flexible circuit board 54 (though used in a combination and manner heretofor unknown in the art). This has a first, or body, portion 54a and a second, or finger, portion 54b which extends from the body portion 54a. On the body portion 54a, the routing element 54 has solder pads (e.g., 58a–58d) or other junctions—here, collectively referred to as "solder pads"—that are electrically coupled with vias 56a–56d that pass along the body portion 54a, and through the finger portion 54b. At a distal end of the finger portion 54b, those vias 56a–56d terminate in an edge connector 59. Here, that edge connector 59 comprises an array of solder pads integral to the finger portion and to the respective vias. In other embodiments, other forms of connectors (edge or otherwise) can be used.

The solder pads, e.g., 58a–58d, include apertures through which pins, e.g., 80a–80d, on the solder face 50b of the board 50 extend, e.g., to ensure electrical coupling with those pins and to provide closeness of fit between flexible board 54 and circuit board 50. Further apertures (e.g., 60a–60c) are formed into body portion 54a to accommodate other pins or structural features on or extending from the solder face 50b of the circuit board 50. The further apertures, which are preferably not surrounded by solder pads nor coupled to vias, also provide closeness of fit between flexible board 54 and circuit board 50, as well as ensuring registration of the solder pads 58 and their pins or solder pads on face 50b.

In a preferred embodiment, the solder pads 58a–58c are marked (e.g., with arrowheads 59a–59d or otherwise) to distinguish them from the further apertures 60a–60c, for purposes of soldering and/or inspection. Of course, the other apertures (e.g., 60a–60c) can be marked in addition or instead.

The routing element 54 can be fabricated from conventional materials (e.g., polymeric sheets) and in conventional ways (e.g., photolithography) known used in the art of flexible circuit board and/or ribbon cable fabrication. During fabrication, solder pads 58a–58c and their corresponding apertures are formed and positioned for accord with the position of pins and/or solder pads of interest on the solder face 54b—i.e., those which are to be electrically coupled with off-board devices components or otherwise by way of vias 56a–56d and connector 59. Apertures 60a–60c are likewise formed and positioned during fabrication for accord with the positions of the respective pins or structural features that they are to accommodate.

Though generally shown as rectangular in the illustration, body portion 54a can be of any other shape, e.g., suitable to cover face 50b and/or those pins/solder pads of interest. Likewise, though finger portion 54b is shown as generally rectangular and extending from portion 54a, those skilled in the art will appreciate that portion 54b may extend in other directions and/or may be of other shapes. Moreover, it will be appreciated that multiple such fingers portions may be provided, each carrying a common and/or respective set of signals.

Figure 4A:
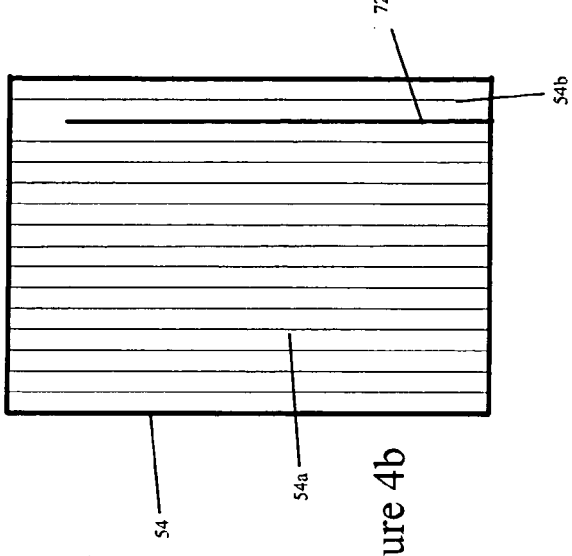
FIGS. 4a through 4c depict aspects of manufacture of a routing element according to the invention.
Figure 4B:
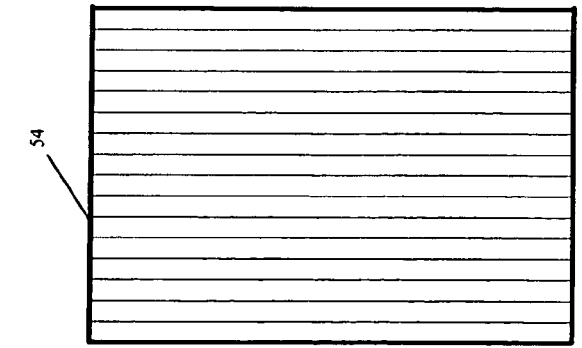
Figure 4C:
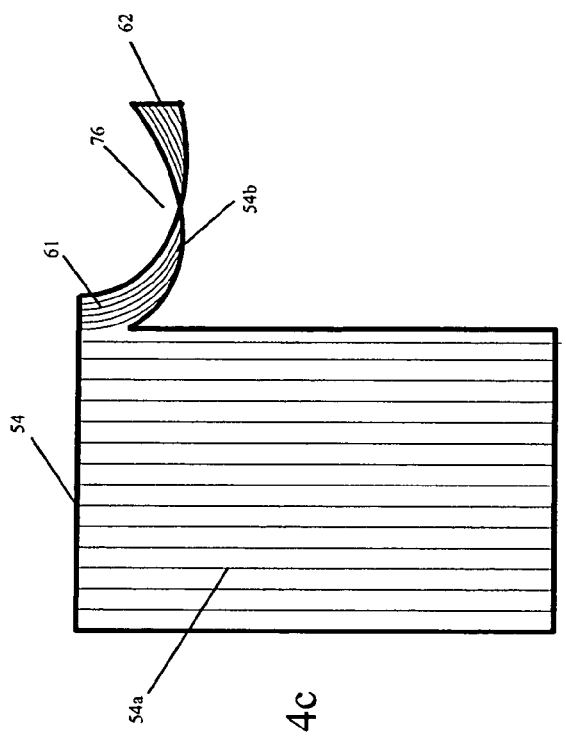

For cost saving or other purposes, finger member 54b can be formed from substrate material integral with and adjacent to that of body portion 54a. FIG. 4a depicts a rectangular shaped flexible substrate 54 that forms the basis for manufacture of the board. FIG. 4b shows a cut 72 made in the substrate 54 that will become the edge of the finger member 54b and body portion 54a. After the cut 72 is made, the member 54b can be folded 76 (FIG. 4c) to achieve the desired configuration. It is anticipated that this method can be used to form other shaped boards, as well. This forming of the member reduces waste inherent in manufacturing since all of the substrate material is utilized by the board.

Installation of the board 54 can be accomplished after the circuit board 50 is manufactured and populated with components. Soldering of the board 54 requires less heat then required to damage or otherwise reduce the integrity of existing soldered components on the circuit board.

The illustrated and other embodiments in accord with the invention have several advantages over the prior art. For example, use of flexible circuit board (or other flexible planar member) to carry signaling to and/or from pins and/or solder pads on the board 50, reduces air constricting space and/or real estate otherwise occupied by cabling and connectors. Moreover, it permits ready access to signals that are not readily available through pre-fabricated connectors, or otherwise. Still further, it provides a low-cost mechanism for carrying signals to and/or from a variety of board types, e.g., to a common interface circuitry.

Thus, for example, digital data processing systems incorporating the invention can be manufactured using a variety of boards 50, all providing similar functionality but not having identical layouts. A flexible circuit 54 can be configured for each of the boards to carry requisite signals to a circuitry, e.g., user interface circuitry or controller circuitry, common to all of the digital data processing systems. Such a flexible circuitry can be retrofit to the boards without risk of damage to its circuitry, and provides a low cost, space-saving solution to separately wiring, re-etching and or pre-fabricating the boards for use with such digital data processing systems.

Described above are signal routing elements and boards and systems that use them meeting the desired objects. It will be appreciated, of course, that the illustrated embodiments are mere examples of the invention and the other embodiments incorporating modifications thereto also fall within the scope of the invention. Thus, by way of non limiting example, signal routing elements as described above can be used in conjunction with boards that have components mounted on the solder side and/or solder pads disposed on the face side—and, indeed, can be mounted on one or both sides of such boards.

Therefore, in view of the above, what we claim is:

1. A signal routing element for use with a circuit device of the type having
   a printed circuit board having a substrate with one or more electrical components already mounted thereon and having,
   pads, pins and/or throughways (collectively, "pads") to which those components are soldered;
the signal routing element comprising
   A. a first portion comprising a flexible planar sheet having
      (a) a plurality of signal conducting junctions thereon that correspond in location to a plurality of respective pads on the circuit board to which respective said electrical components are soldered,
      (b) one or more signal conducting vias each electrically coupled to at least one signal conducting junction,
   B. a second portion that extends from the first portion, the second portion comprising one or more signal conductors coupled to each of the one or more of the signal conducting vias on the first portion,
   C. the signal routing element being arranged to couple to the substrate for disposition such that substrate and the pads are sandwiched between the signal routing element and the electrical components.

2. A signal routing element for use with a circuit device of the type having
   a printed circuit board with one or more electrical components already mounted thereon and having,
   pads, pins and/or throughways (collectively, "pads") to which those components are soldered;
the signal routing element comprising
   A. a first portion comprising a flexible planar sheet having
      (a) a plurality of signal conducting junctions thereon that correspond in location to a plurality of respective pads on the circuit board to which respective electrical components are soldered,
      (b) one or more signal conducting vias each electrically coupled to at least one signal conducting junction,
      (c) the first portion sized so that, when it is placed in physical contact with a printed circuit board that has the components already mounted thereon, the signal conducting junctions align with their respective pads so as to permit electrical coupling of signals therebetween;
   B. a second portion that extends from the first portion, the second portion comprising
      (a) one or more signal conductors coupled to each of the one or more of the signal conducting vias on the first portion,
      (b) the second portion being disposed to at least one of
         (i) carry signals from the selected pads to one or more locations off the circuit board by way of the signal conducting junctions of the first portion, the signal conducting vias of the first portion, and the signal conductors of the second portion, and (ii) carry signals to the selected pads from one or more locations off the circuit board via the signal conductors of the second portion, the signal conducting vias of the first portion, and the signal conducting junctions of the first portion.

3. The signal routing element of claim 1, wherein the first and second portions are formed from a single sheet.

4. The signal routing element of claim 3, wherein the first and second portions are formed from a single sheet comprising a thin, flexible substrate.

5. The signal routing element of claim 4, wherein the first and second portions are formed from a single polymeric sheet.

6. The signal routing element of claim 2, wherein the signal conductors of the second portion comprise conductive vias.

7. The signal routing element of claim 2, wherein the signal conducting junctions of the first portion comprise solder pads.

8. The signal routing element of claim 1, wherein the locations off the circuit board comprise any of components, devices, or further circuit boards.

9. A printed circuit board assembly comprising
   A. a substrate with (i) one or more electrical components mounted thereon and (ii) pads, pins and/or throughways (collectively, "pads") to which those components are soldered;
   B. a signal routing element coupled to the substrate and disposed such that substrate and the pads are sandwiched between the signal routing element and the electrical components, the signal routing element comprising
      I. a first portion comprising a flexible planar sheet having
         (a) a plurality of signal conducting junctions thereon that correspond in location to a plurality of respective pads on the circuit board to which respective electrical components are soldered,
         (b) one or more signal conducting vias each electrically coupled to at least one signal conducting junction,
         (c) the first portion sized so that, when it is placed in physical contact with a printed circuit board that has the components already mounted thereon, the signal conducting junctions align with their respective pads so as to permit electrical coupling of signals therebetween;
      II. a second portion that extends from the first portion, the second portion comprising
         (a) one or more signal conductors coupled to each of the one or more of the signal conducting vias on the first portion,
         (b) the second portion being disposed to at least one of
            (i) carry signals from the selected pads to one or more locations off the circuit board by way of the signal conducting junctions of the first portion, the signal conducting vias of the first portion, and the signal conductors of the second portion, and
            (ii) carry signals to the selected pads from one or more locations off the circuit board via the signal conductors of the second portion, the signal conducting vias of the first portion, and the signal conducting junctions of the first portion.

10. The signal routing element of claim 9, wherein the first and second portions are formed from a single sheet.

11. The signal routing element of claim 10, wherein the first and second portions are formed from a single sheet comprising a thin, flexible substrate.

12. The signal routing element of claim 11, wherein the first and second portions are formed from a single polymeric sheet.

13. The signal routing element of claim 9, wherein the signal conductors of the second portion comprise conductive vias.

14. The signal routing element of claim 9, wherein the signal conducting junctions of the first portion comprise solder pads.

15. The signal routing element of claim 9, wherein the locations off the circuit board comprise any of components, devices, or further circuit boards.

16. A signal routing element for use with a circuit device of the type having
   a printed circuit board with one or more electrical components already mounted thereon and having,
   pads, pins and/or throughwaves (collectively, "pads") to which those components are electrically coupled;
   the signal routing element comprising
   A. a first portion comprising a flexible planar sheet having
      (a) one or more signal conducting junctions thereon that correspond in location to one or more selected, respective pads on the circuit board,
      (b) one or more signal conducting vias each electrically coupled to at least one signal conducting junction,
      (c) the first portion sized so that when it is placed in physical contact with a printed circuit board that has the components already mounted thereon, the signal conducting junctions align with their respective pads so as to permit electrical coupling of signals therebetween;
   B. a second portion that extends from the first portion, the second portion comprising
      (a) one or more signal conductors coupled to each of the one or more of the signal conducting vias on the first portion,
      (b) the second portion being disposed to at least one of
         (i) carrying signals from the selected pads to one or more locations off the circuit board by way of the signal conducting junctions of the first portion, the signal conducting vias of the first portion, and the signal conductors of the second portion, and
         (ii) carry signals to the selected pads from one or more locations off the circuit board via the signal conductors of the second portion, the signal conducting vias of the first portion, and the signal conducting junctions of the first portion,
   C. wherein the signal conducting junctions of the first portion comprise solder pads and wherein the solder pads are visually denoted for identification.

17. A printed circuit board assembly comprising
   A. a substrate with (i) one or more electrical components mounted thereon and (ii) pads, pins and/or throughways (collectively, "pads") to which those components are electrically coupled;
   B. a signal routing element coupled to the substrate and disposed such that substrate and the pads are sandwiched between the signal routing element and the electrical components, the signal routing element comprising I. a first portion comprising a flexible planar sheet having
  (a) one or more signal conducting junctions thereon that correspond in location to one or more selected, respective pads on the circuit board,
  (b) one or more signal conducting vias each electrically coupled to at least one signal conducting junction,
  (c) the first portion sized so that, when it is placed in physical contact with a printed circuit board that has the components already mounted thereon, the signal conducting junctions align with their respective pads so as to permit electrical coupling of signals therebetween;
II. a second portion that extends from the first portion, the second portion comprising
  (a) one or more signal conductors coupled to each of the one or more of the signal conducting vias on the first portion,
  (b) the second portion being disposed to at least one of
    (i) carry signals from the selected pads to one or more locations off the circuit board by way of the signal conducting junctions of the first portion, the signal conducting vias of the first portion, and the signal conductors of the second portion, and
    (ii) carry signals to the selected pads from one or more locations off the circuit board via the signal conductors of the second portion, the signal conducting vias of the first portion, and the signal conducting junctions of the first portion
III. wherein the signal conducting junctions of the first portion comprise solder pads and wherein the solder pads are visually denoted for identification.

18. A method of fabricating a printed circuit board assembly, comprising
  A. assembling a printed circuit board comprising substrate with (i) one or more electrical components mounted thereon and (ii) pads, pins and/or throughways (collectively, "pads") to which those components are soldered;
  B. affixing a signal routing element to the substrate, such that substrate and the pads are sandwiched between the signal routing element and the electrical components, the signal routing element comprising
    I. a first portion comprising a flexible planar sheet having
      (a) a plurality of signal conducting junctions thereon that correspond in location to a plurality of respective pads on the circuit board to which respective said electrical components are soldered,
      (b) one or more signal conducting vias each electrically coupled to at least one signal conducting junction,
      (c) the first portion sized so that, when it is placed in physical contact with a printed circuit board that has the components already mounted thereon, the signal conducting junctions align with their respective pads so as to permit electrical coupling of signals therebetween;
    II. a second portion that extends from the first portion, the second portion comprising
      (a) one or more signal conductors coupled to each of the one or more of the signal conducting vias on the first portion,
      (b) the second portion being disposed to at least one of
        (i) carry signals from the selected pads to one or more locations off the circuit board by way of the signal conducting junctions of the first portion, the signal conducting vias of the first portion, and the signal conductors of the second portion, and
        (ii) carry signals to the selected pads from one or more locations off the circuit board via the signal conductors of the second portion, the signal conducting vias of the first portion, and the signal conducting junctions of the first portion.

* * * * *